(12) United States Patent
McGinn et al.

(10) Patent No.: US 6,977,384 B2
(45) Date of Patent: Dec. 20, 2005

(54) SHAPED SPUTTER SHIELDS FOR IMPROVED ION COLUMN OPERATION

(75) Inventors: James B. McGinn, Portland, OR (US);
Gregory A. Schwind, Portland, OR (US)

(73) Assignee: FEI Company, Hillsboro, OR (US)

( * ) Notice: Subject to any disclaimer, the term of this patent is extended or adjusted under 35 U.S.C. 154(b) by 63 days.

(21) Appl. No.: 10/668,431

(22) Filed: Sep. 23, 2003

(65) Prior Publication Data

US 2005/0045834 A1    Mar. 3, 2005

Related U.S. Application Data

(60) Provisional application No. 60/498,067, filed on Aug. 27, 2003.

(51) Int. Cl.[7] .............................................. H01J 27/00
(52) U.S. Cl. ................. 250/423 R; 250/505.1
(58) Field of Search ........................... 250/423 R, 505.1

(56) References Cited

U.S. PATENT DOCUMENTS 4,698,236 A  * 10/1987  Kellogg et al. ............. 427/526
5,034,612 A     7/1991  Ward et al.

* cited by examiner

*Primary Examiner*—Kiet T. Nguyen
(74) *Attorney, Agent, or Firm*—Michael O. Scheinberg

(57) ABSTRACT

The invention adds one or more surface contour(s) to the bombarded area(s) within ion columns to greatly reduce the likelihood that back sputtered material will reach the ion generating source. A number of different surface contours are disclosed including angled surfaces, surfaces defining cups to capture back sputtered material, pre-textured and forested surfaces. The different surfaces can be used in any combination. The reduction in back sputtered material reaching the ion source reduces the time to stability, greatly increases the working stability, and increases the lifespan of the source.

25 Claims, 14 Drawing Sheets

SHAPED SPUTTER SHIELDS FOR IMPROVED ION COLUMN OPERATION

This application claims priority from U.S. Provisional Patent Application No. 60/498,067, filed on Aug. 27, 2003.

TECHNICAL FIELD OF THE INVENTION

The present invention relates generally to ion columns and their methods, and in particular to an ion column extraction region which minimizes the possibility that material back sputtered from ion impact reaches the ion source.

BACKGROUND OF THE INVENTION

Ion columns and Liquid Metal Ion Source LMIS methods are known and are employed in applications such as failure analysis, circuit edit and structural modification. The extraction region of an ion column includes beam limiting and extraction members, that function to both provide an electric potential to extract ions from the ion source, and to limit the diameter of the beam that passes through a hole defined substantially in the middle thereof. The ions blocked from passing impact the surface of the members and knock molecules free in a process called sputtering.

A common problem occurs when debris from the beam limiting and extraction members is back sputtered upon the source (LMIS). Debris back-sputtered onto the source causes instability in the LMIS ion emission. One solution to the back sputtered debris problem is described by Ward et al. in U.S. Pat. No. 5,034,612. Ward et al. constructs portions of the beam limiting and extraction apparatus using source friendly material. Source friendly material is defined as a material if attached to or impacted on the source has minimal impact on the source stability. Appropriate source friendly materials depend upon the composition of the source but can include, for example, W, Al, Cu, V, Nb, Ta, Re, Ti or its alloys.

Unfortunately no perfect source friendly material has been found. Some source friendly materials tend to have poor dimensional stability and are therefore inappropriate to use in the optical elements of the charged particle beam column. Some materials, although source friendly, actually have higher sputter rates, which cause more material to be back-sputtered onto the source. While proper selection of beam limiting and extraction materials helps extend the stability of the LMIS ion beam emitter, eventually the source will begin to fail. Source heat cycling can extend the life the life of a source. Heating the source causes contaminants to vaporize or sink below the surface of the liquid metal. Heating can be accomplished by passing a current through a filament which suspends the liquid metal source in place.

A prior art LMIS arrangement is shown generically in FIG. 1 by reference numeral 10. The source 12, suspended by an electrical filament 13, includes a needle shaped emitter 14 and a supply of liquid metal shown contained in a reservoir 16. The capacity of the reservoir 16 and the quantity of liquid metal is selected to ensure it does not become the source life limiter. The liquid metal runs from the reservoir 16 and down the emitter 14 in a thin film represented here by multiple drops 18. When the liquid metal reaches the end of the emitter 14, metal ions are extracted from the emitter and accelerated in a direction 20 toward a work piece by an extraction electrode 22. The ion current is controlled by the interaction between the flow of liquid metal atoms down the source 12 the electric potential of the extractor electrode or extraction cup 22, and the electric potential of a current control or suppression electrode 24. The ions leave the emitter 14 and form a beam 26. The beam 26 spreads as it leaves the source forming an emission cone 28 with the apex of the cone at tip of the emitter 14.

The beam 26 passes through a number of holes in the beam limiting and extraction members as the ions move toward the work piece 20. Each of these holes limit the outer envelope commonly referred to as the beam diameter. The beam 26 passes into the extraction cup 22 through a top hole 30. The shield 32 has a bottom hole 34 smaller than the extraction electrode top hole 30 which allows only the central portion of the beam 26 to pass. The portion of the beam 26 that passes through the shield bottom hole 34 impinges on a bottom plate 36 of the extraction cup 22.

The bottom plate contains a beam defining aperture or BDA 38. The term beam defining aperture (BDA) is usually used to describe the disk shaped element itself as well as the hole, or aperture 39 that passes through it. The aperture 39 in the BDA is significantly smaller than the other holes in the arrangement and consequently allows only small fraction of the original beam to pass through to the work piece. The majority of the beam impacts the shield 32, and the BDA 38.

When an ion beam impacts a surface with significant momentum, the molecules or atoms of the surface are consequently knocked free by a process commonly known as sputtering. Sputtered atoms are ejected in an oblong cloud with a central axis primarily in a direction near the normal to the surface. Since the surfaces impacted are perpendicular to the beam direction and source location, a high percentage of the sputtered debris is at risk of impacting the source. When sputtered material reaches the source it is described as back sputtered.

The shorter the distance from the BDA to the source the greater the probability of sputter impact on the source. However, increasing the distance reduces the column performance by reducing the resolution and/or beam current on the work piece.

SUMMARY OF THE INVENTION

An object of the invention is to extend the life of a charged particle beam source by reducing the possibility that molecules of sputtered material will reach the ion source.

The invention adds one or more surface contour(s) to bombarded area(s) within charged particle beam columns to greatly reduce the likelihood that sputtered material will reach the particle generating source. Different embodiments use a number of different surface contours, including angled surfaces, surfaces defining cups to capture sputtered material, pre-textured and forested surfaces. The different surfaces can be used in any combination. The reduction in back sputtered material reaching the source reduces the time to stability, greatly increases the working stability, and increases the lifespan of the source.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes as the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, the following description is made with reference to the accompanying drawings, in which.

DETAILED DESCRIPTION OF THE PREFERRED EMBODIMENTS

Figure 1:
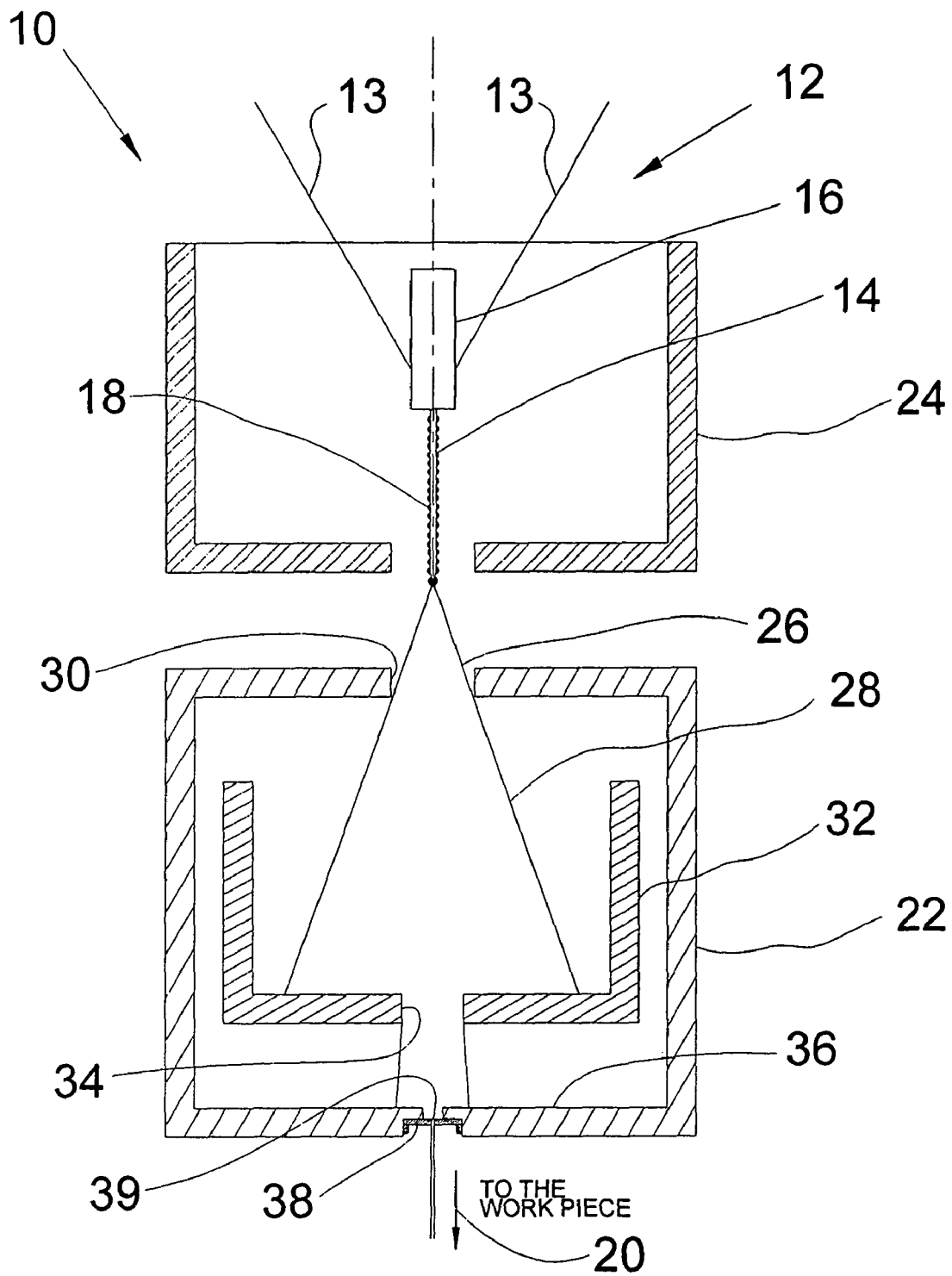
FIG. 1 is a cross-sectional view of a prior art example of an ion beam arrangement discussed hereinabove.

The Figures show only an extraction region of an ion column assembly. In addition, where shown, the source is placed at the top of the drawing, and the beam points downward toward the work piece. It should be understood in practice the beam can point in any direction.

FIGS. 2–9 illustrate a first group of embodiments of the invention wherein sputtered material is inhibited from reaching the source by directing the sputter flux away from the source. FIGS. 10–16 illustrate a second group of embodiments wherein sputtered material is captured thereby inhibiting sputtered material from reaching the source. FIGS. 17–20 illustrate a third group of embodiments wherein a microscopically textured or forested surface is used to inhibit sputter from reaching the ion source. It will be understood that other geometric shapes or combinations of shapes can be used, and elements from any one group of embodiments can be mixed with elements from the same or other groups of embodiments, and any combination of each of the embodiments illustrated can be combined for great advantage while keeping within the spirit of the invention.

Figure 2:
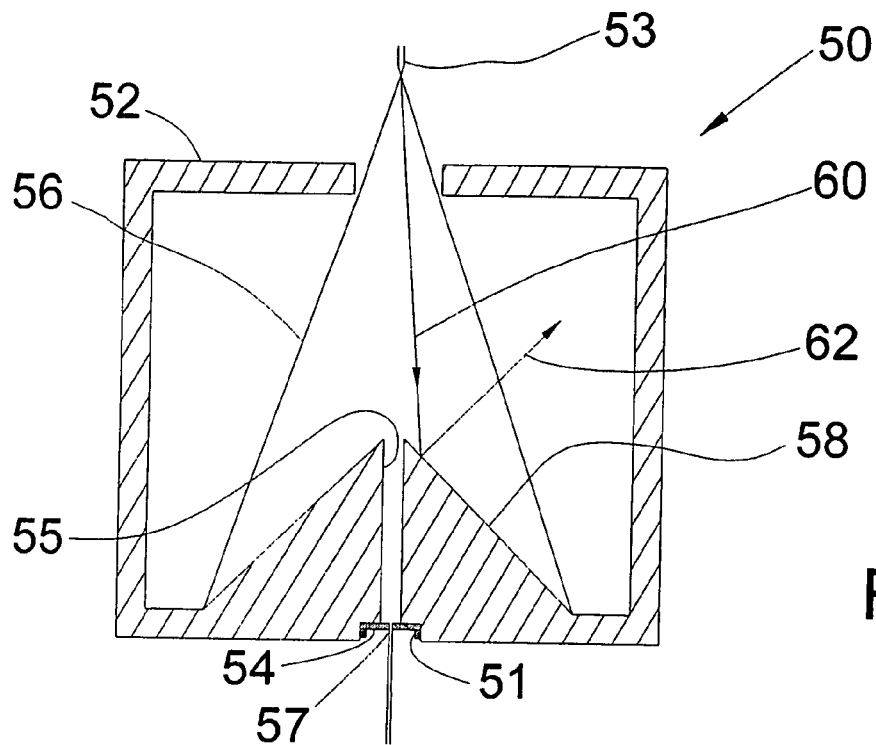
FIG. 2 is a cross-sectional view of a first embodiment according to the invention.

FIG. 2 is a cross-sectional view showing the extraction region of an ion column assembly according to a first embodiment of the invention generally identified by reference numeral 50 wherein the shield and the bottom wall of the extraction electrode are made integrally as one piece identified in this example as the extraction electrode 52. The extraction electrode 52 accelerates the ions in a direction toward the work piece. As the ion flux leaves the source 53 the ions spread out into an emission cone 56. Only the centermost portion of the emission cone 56 reaches a beam defining aperture 54. In this example of the invention the beam defining aperture 54 is made as a separate piece fit into the bottom of the extraction electrode 52, and held in place by a suitable means such as detent 51. A small portion of the beam passes through bore 55 and an even smaller portion passes through a hole 57 defined in the center of the beam defining aperture 54. A majority portion of the emission cone 56 strikes the angled surface 58. Material knocked free by the beam is harmlessly sputtered in a direction away from the source 53. An illustrative path of an incident ion is shown by arrow 60. Sputtered material is shown leaving the angled surface 58 in direction 62 where direction 62 is normal to the angled surface 58.

Figure 3:
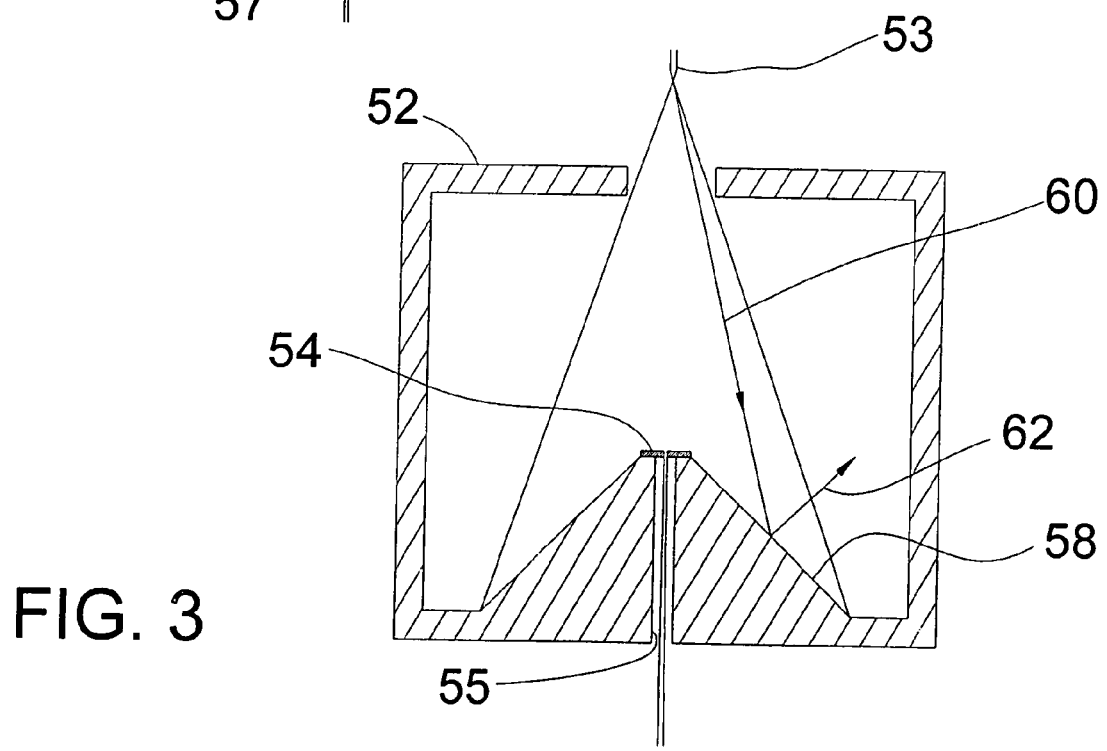
FIG. 3 is a cross-sectional view of a second embodiment according to the invention.

FIG. 3 is a cross-sectional view showing a second embodiment according the invention wherein the extraction electrode 52 has an angled surface 58 forming a cone. A beam defining aperture 54 is mounted near the apex of the cone in line with a bore 59 defined along the axis of the cone. An illustrative path of an incident ion 60 causes material to sputter in direction 62, away from the source 53.

Figure 4:
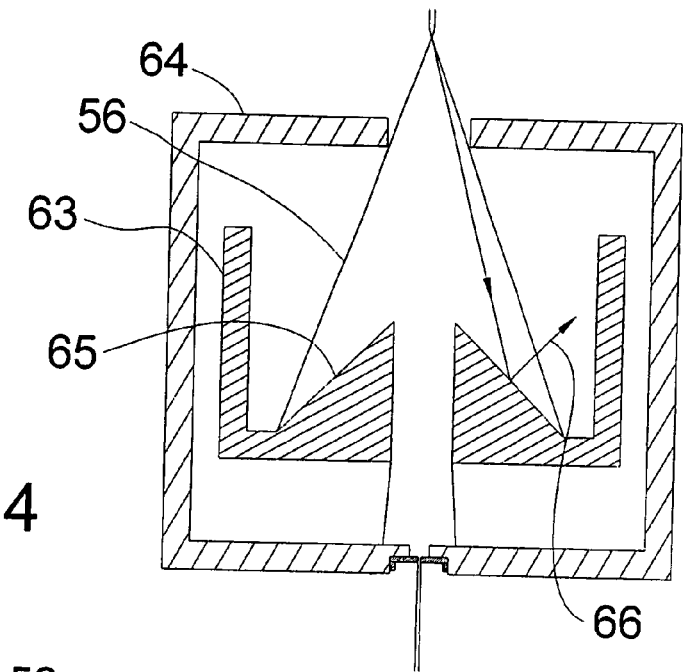
FIG. 4 is a cross-sectional view of a third embodiment according to the invention.

FIG. 4 is a cross-sectional view showing a third embodiment according to the invention wherein the shield 63 is separate from the extraction electrode 64. The shield has an angled surface 65 which when impacted by ions within the emission cone 56 deflects sputtered material in direction 66.

Figure 5:
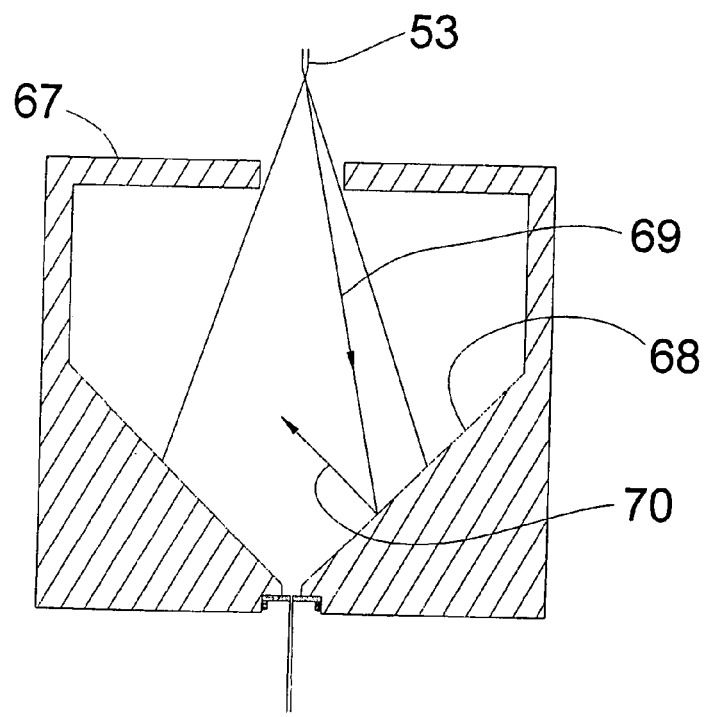
FIG. 5 is a cross-sectional view of a fourth embodiment according to the invention.

FIG. 5 is a cross-sectional view illustrating the invention, as a forth embodiment similar to the first and second embodiment shown in FIGS. 2 and 3, wherein the shield and the extraction electrode are made integrally. The integral extraction electrode 67 has angled surfaces 68 pointing inwardly. Again an illustrative path of an incident ion is shown by arrow 69. Sputtered material is shown to be ejected from the angled surface 68 in direction 70 inhibiting it from reaching the source 53.

Figure 6:
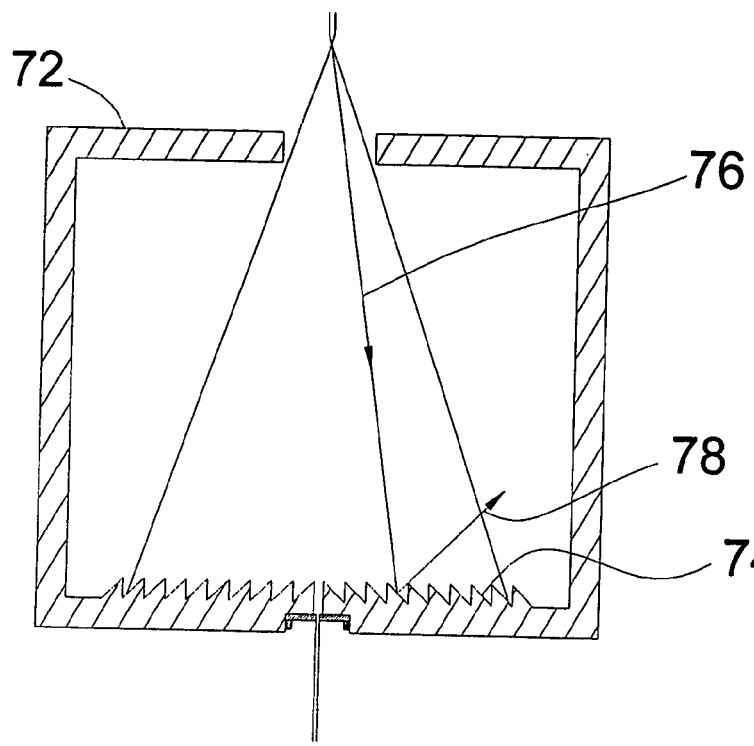
FIG. 6 is a cross-sectional view of a fifth embodiment according to the invention.

FIG. 6 is a cross-sectional view showing a fifth embodiment similar to FIG. 2, 3 and 5 in that the shield is made integral with the extraction electrode, identified in this example as extraction electrode 72. The extraction electrode in this example includes a plurality of angled surfaces 74. Here again an illustrative path of an incident ion is shown by arrow 76, and sputtered material is shown to be ejected from one of the angled surfaces 74 in direction 78.

Figure 7:
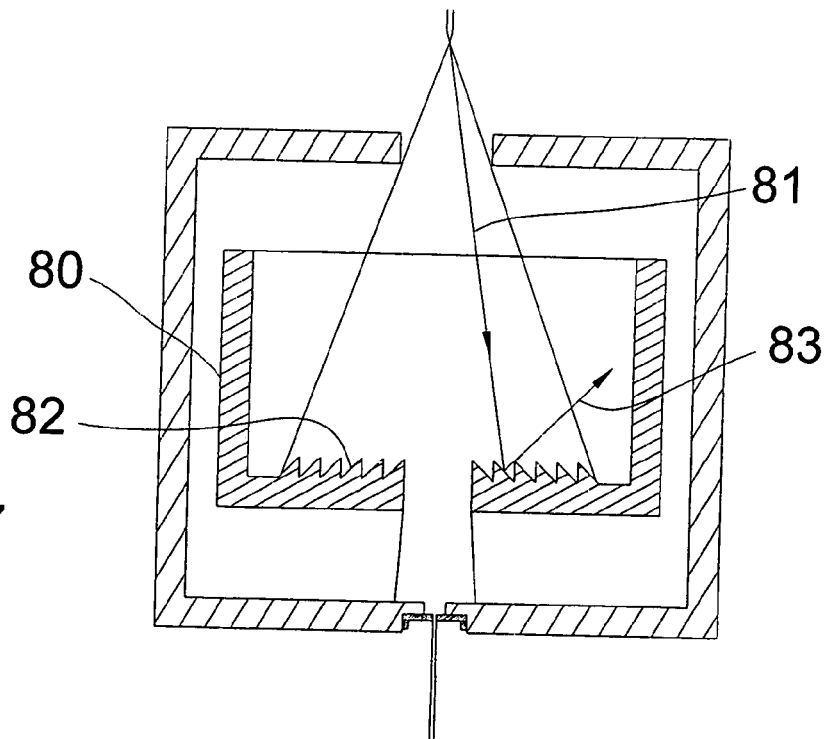
FIG. 7 is a cross-sectional view of a sixth embodiment according to the invention.

FIG. 7 is a cross-sectional view showing a sixth embodiment according to the invention wherein a shield 80 has a plurality of angular surfaces 82. Here again an illustrative path of an incident ion is shown by arrow 81, and sputtered material is shown to be ejected from one of the angled surfaces 82 in direction 83.

Figure 8:
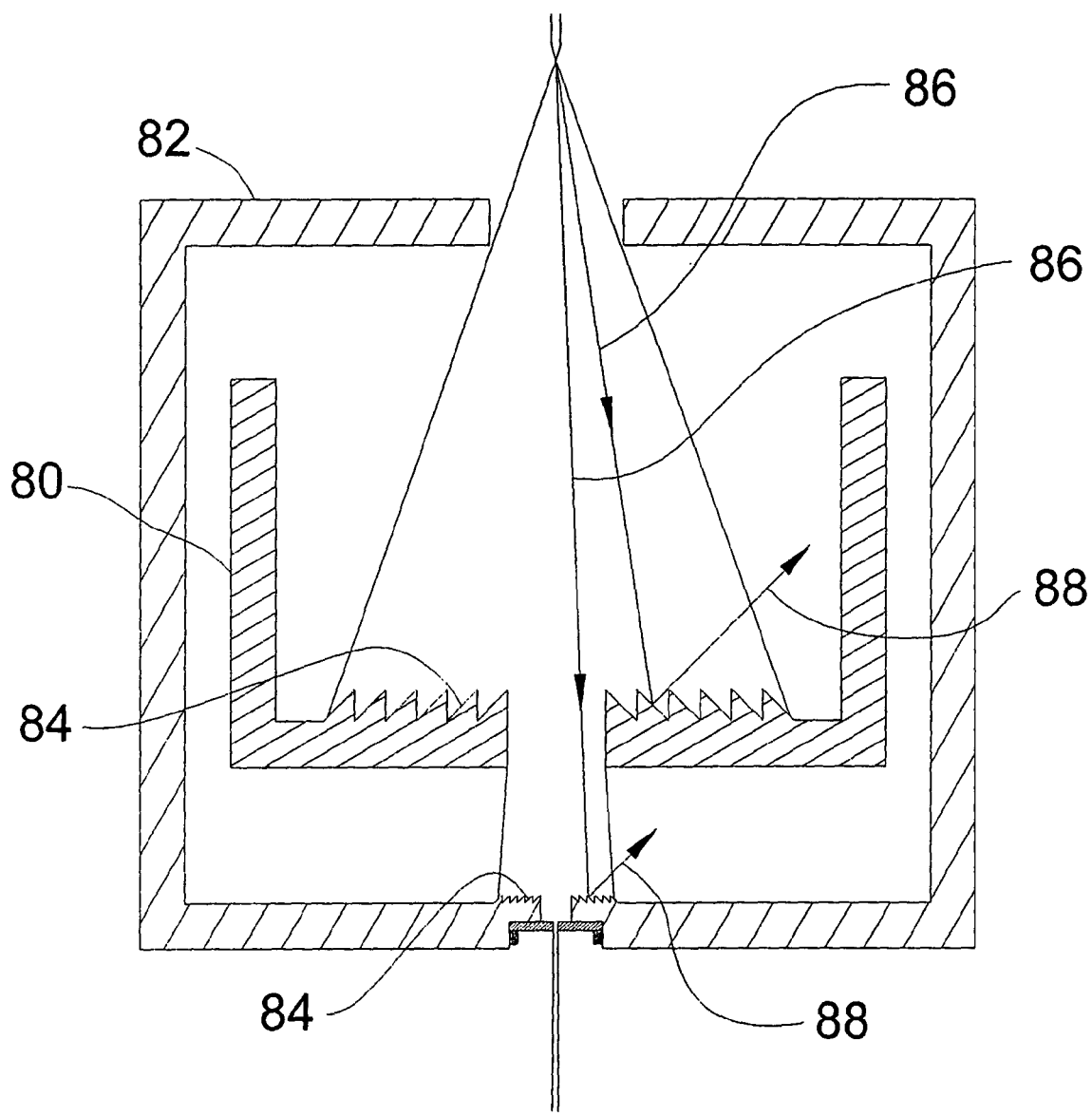
FIG. 8 is a cross-sectional view of a seventh embodiment according to the invention.

FIG. 8 is a cross-sectional view showing a seventh embodiment according to the invention wherein the shield 80 and the extraction electrode 82 both include a plurality of angled surfaces 84. Here two illustrative ion beams 86 are shown impacting the angled surfaces 84. Sputtered material is shown ejected normal to the angles surfaces 84 in direction 88.

Figure 9:
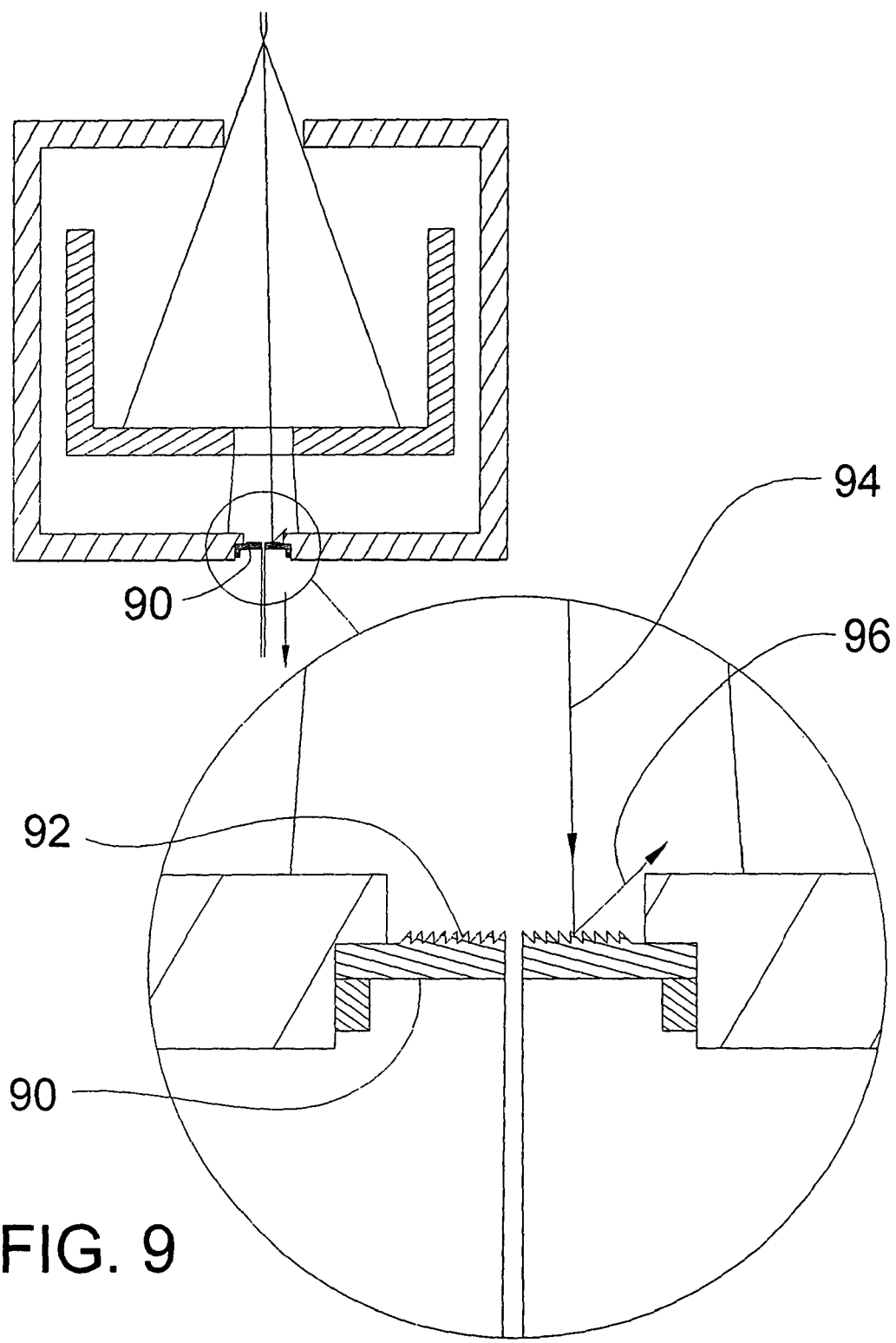
FIG. 9 is a cross-sectional view of a eighth embodiment according to the invention.

FIG. 9 is a cross-sectional view with a portion blown up within a circle to illustrate detail. The figure shows an eighth embodiment according to the invention wherein a beam defining aperture 90 has a plurality of angled surfaces 92. An illustrative ion beam 94 is shown striking one angled surface 92. Sputtered material is shown ejected normal to the angled surface 92 in direction 96.

Figure 10:
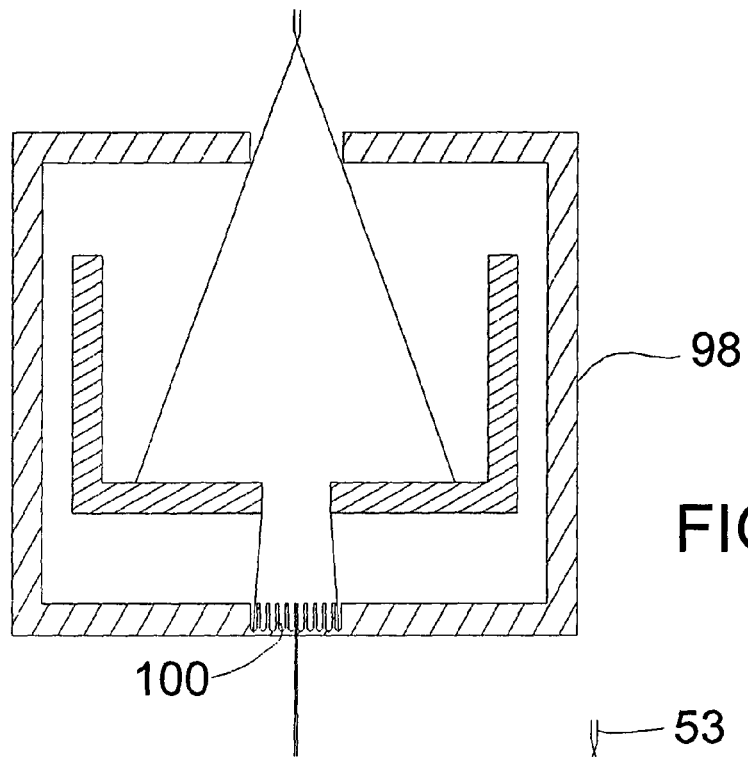
FIG. 10 is a cross-sectional view of a ninth embodiment according to the invention.

FIG. 10 begins illustrating a second group of embodiments according to a second aspect of the invention illustrating another method of inhibiting back sputtered material from impacting the ion source. A ninth embodiment is illustrated wherein a beam defining aperture is made integral with the extraction electrode 98. The extraction electrode includes a plurality of holes or cups 100 which trap sputtered material ejected when ions impact the inside surface of the cups 100. While the cups shown are cylindrical, the term "cups" is used to include any holes or depressions in the surface, regardless of shape.

Figure 11:
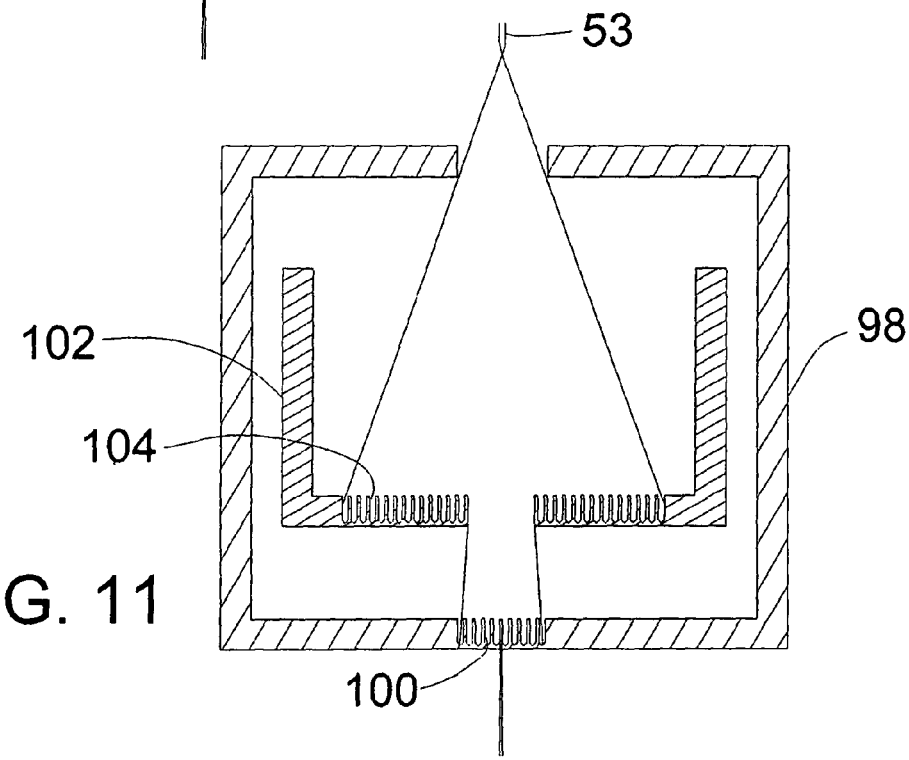
FIG. 11 is a cross-sectional view of a tenth embodiment according to the invention.

FIG. 11 is a cross-sectional view showing a tenth embodiment according to the invention wherein a shield 102 defines a plurality of cups 104 arranged to trap back sputtered material released when impacted by ions from the source 53. This embodiment also includes cups 100 defined by the extraction electrode 98 similar to those shown in FIG. 10.

Figure 12:
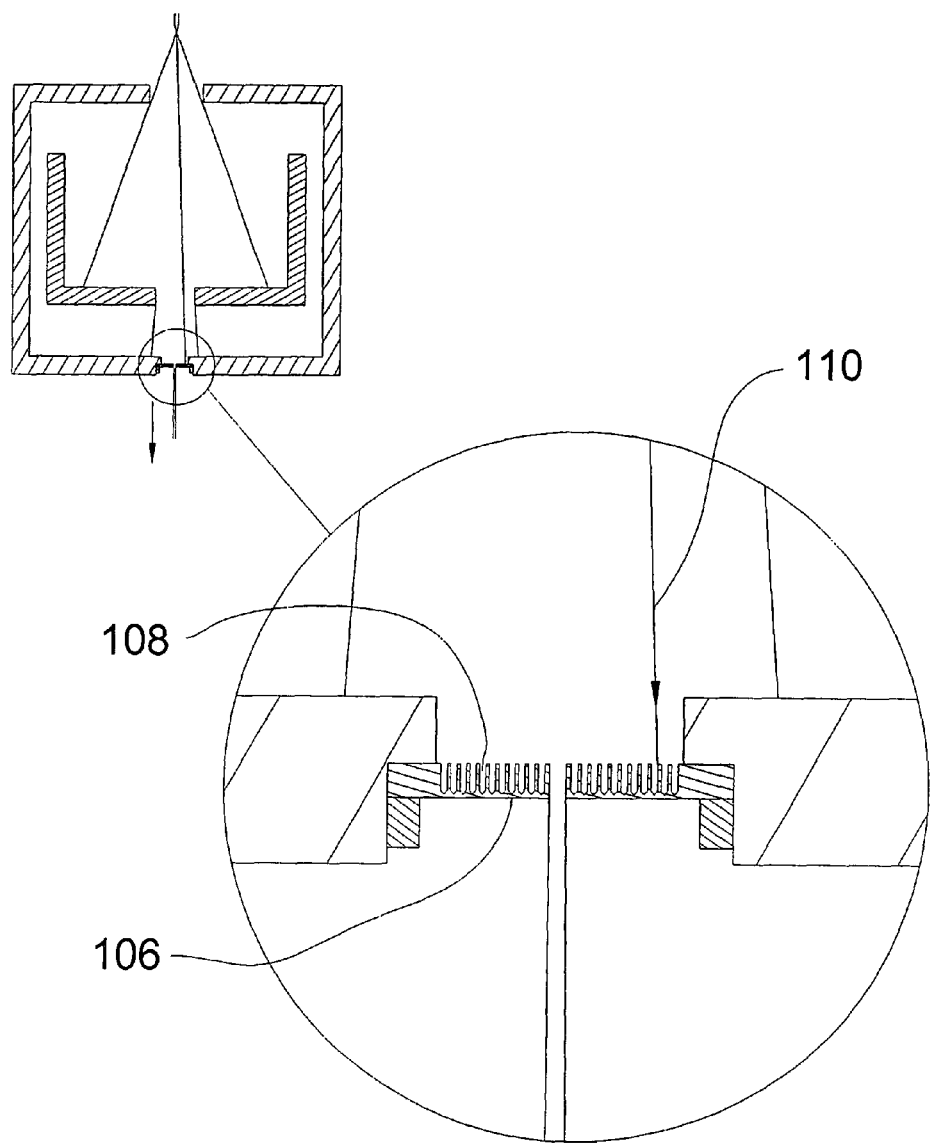
FIG. 12 is a cross-sectional view of a eleventh embodiment according to the invention.

FIG. 12 is a cross-sectional view with a portion blown up within a circle to illustrate detail. The figure shows an eleventh embodiment according to the invention wherein the beam defining aperture 106 defines a plurality of cups 108 to trap sputtered material released upon impact from ions as represented by path of an incident ion 110.

Figure 13:
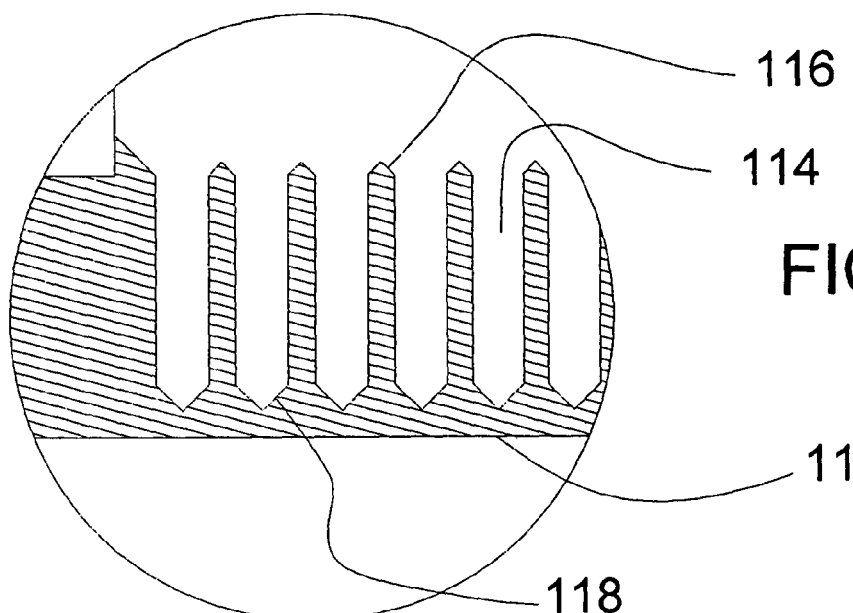
FIG. 13 is a cross-sectional view of a twelfth embodiment according to the invention.

FIG. 13 is a cross-sectional blown up view of a twelfth embodiment according to the invention. A beam defining aperture 112 defines a plurality of cups 114 which trap sputtered material as discussed. Included in this embodiment is a plurality of angle surfaces 116 between each of the plurality of cups 114. When ions strike the portion of the beam defining aperture 112 between the cups 114 the sputtered material is deflected away from the ion source. The detail also shows the bottom of the cups 114 having angled surfaces 118 which deflects sputtered material released upon being struck by an ion at the bottom of the cup. The cups in FIGS. 10–12 are shaped similarly to provide the same advantage.

The cups can also be arranged such that their central axes are non-normal to the surface. It should be understood any angled surface such as those discussed can also define cups therein to provide both a trapping means and deflecting means according to the invention. The cups can have a plurality of different diameters in order that performance and cost can be optimized. The walls of the cups can also be angled from the axis of the cups.

Figure 14:
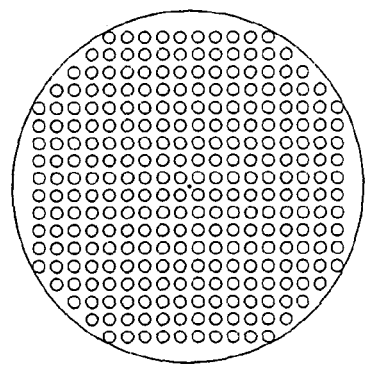
FIG. 14 is top view of a first configuration of the embodiments shown in FIGS. 10–13.
Figure 15:
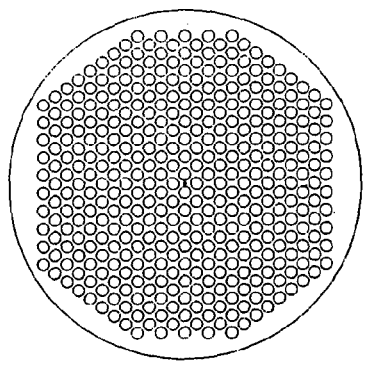
FIG. 15 is top view of a second configuration of the embodiments shown in FIGS. 10–13.
Figure 16:
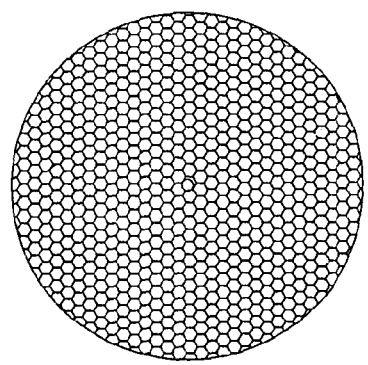
FIG. 16 is top view of a third configuration of the embodiments shown in FIGS. 10–13.

FIGS. 14, 15 and 16 are top views which illustrate a number of different ways the cups shown in FIGS. 10–13 can be configured. FIG. 14 shows circular cups configured in a grid pattern. FIG. 14 shows circular cups configured in a close packed configuration. FIG. 15 illustrates how the cups can be configured in a honeycomb pattern. The invention can be configured with one cup being a through hole, and the beam defining aperture can be positioned within the through hole. The cups are advantageously configured to have diameter to depth aspect ratio of at least 5:1 and ideally a diameter to depth aspect ratio of 10:1. It should be understood any suitable aspect ratio which inhibits sputtered material from reaching the source can be used without departing from the invention.

Figure 17:
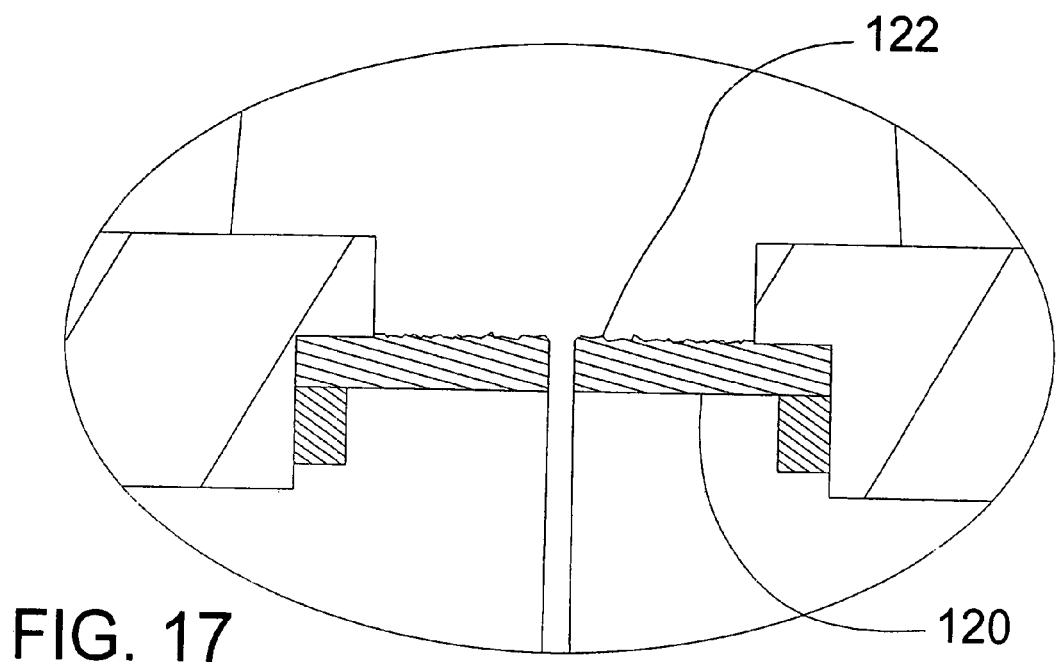
FIG. 17 is a cross-sectional view of a thirteenth embodiment according to the invention.

FIG. 17 is a cut-away detailed view showing an added surface contour on a beam defining aperture 120 having a plurality of surfaces 122 with normals at random angles. The figure also illustrates use of surface texturing prior to use with the ion column by pre-exposure to an ion source. The surfaces 122 can also be added by any suitable means such as by machining.

Figure 18:
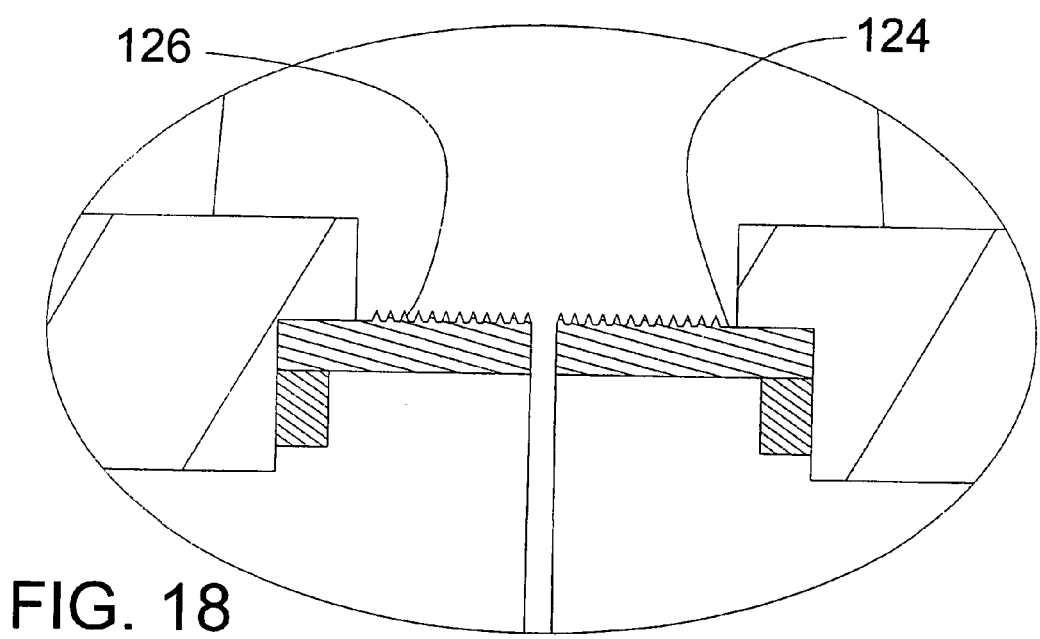
FIG. 18 is a cross-sectional view of a fourteenth embodiment according to the invention.

FIG. 18 shows how an ion stream has been used to form a forested surface 124 of dendrite cones 126 on a flat surface. The cones can also be created using any suitable means including pre-exposure to an ion source prior to use within the ion column.

Figure 19:
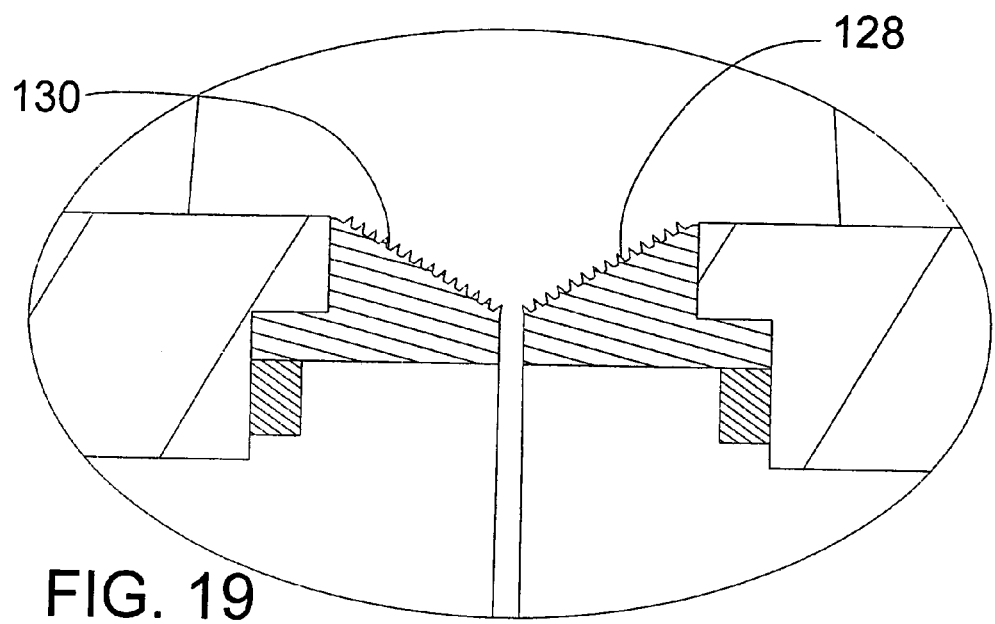
FIG. 19 is a cross-sectional view of a fifteenth embodiment according to the invention.
Figure 20:
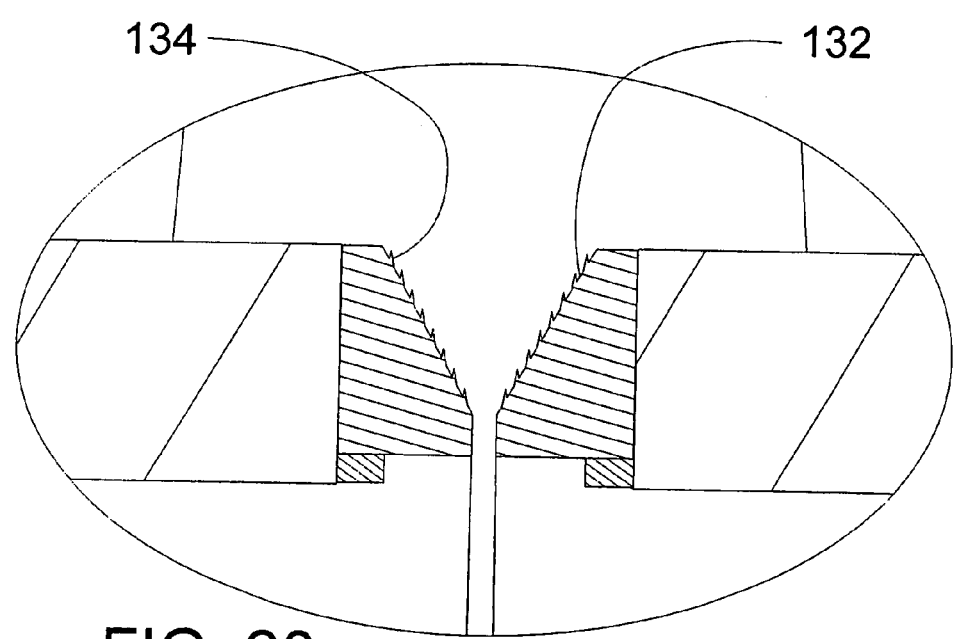
FIG. 20 is a cross-sectional view of a sixteenth embodiment according to the invention.

FIG. 19 illustrates how dendrite cones 128 can be used to advantage on surfaces 130 having normals angled away from the incident beam. In this example the cones 128 are oriented normal to the surfaces 130. The angles shown are relatively shallow but can be made to vary greatly without departing from the invention. FIG. 20 illustrates added surface contours 132 comprising steep angles and dendrite cones 134 which are oriented toward the ion source.

Figure 21:
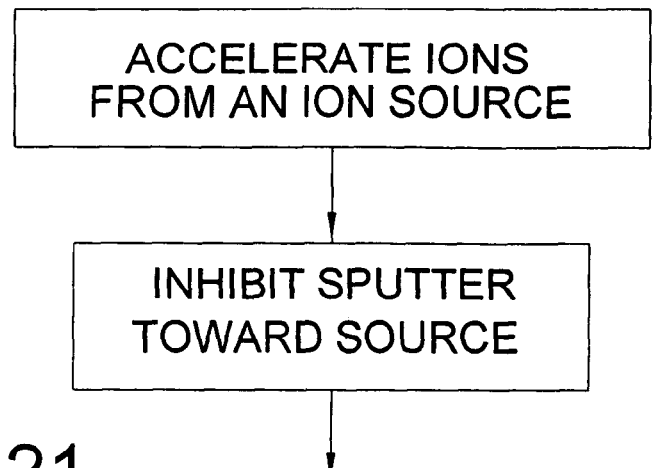
FIG. 21 is a flow chart showing a generic method according to the invention.
Figure 22:
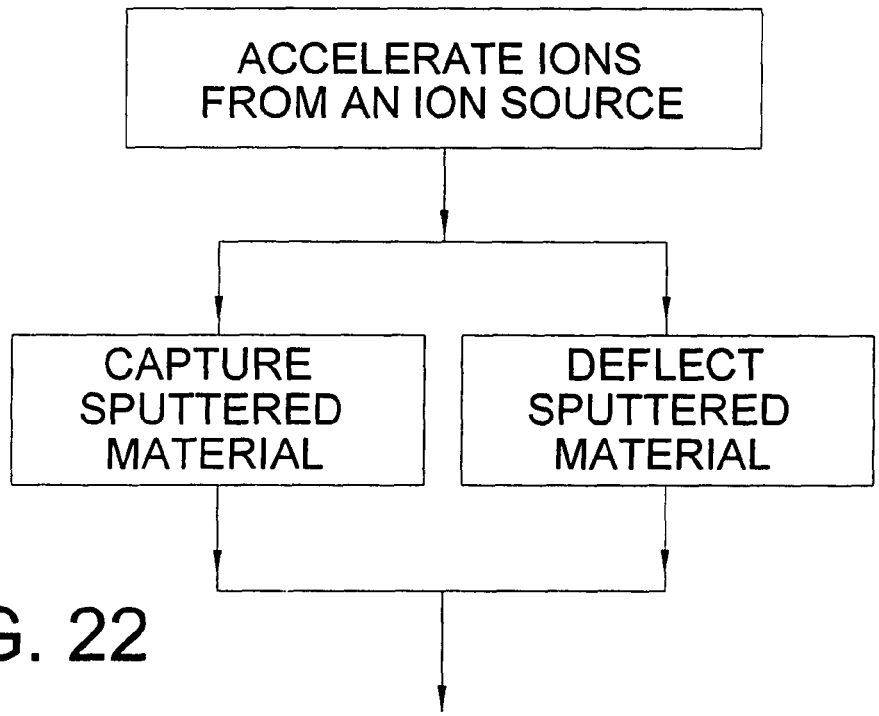
FIG. 22 is a flow chart showing a method according to the invention similar to FIG. 21 with more detailed steps shown.

FIG. 21 is a flow chart showing generically a method according to the invention wherein material caused to sputter from impact with ions accelerated from a source is inhibited from sputtering toward the source. FIG. 22 is a flow chart showing a method according to the invention similar to FIG. 21 wherein separate detailed steps of capturing material and deflecting material are shown as separate steps of inhibiting material from being sputtered toward the source.

Figure 23:
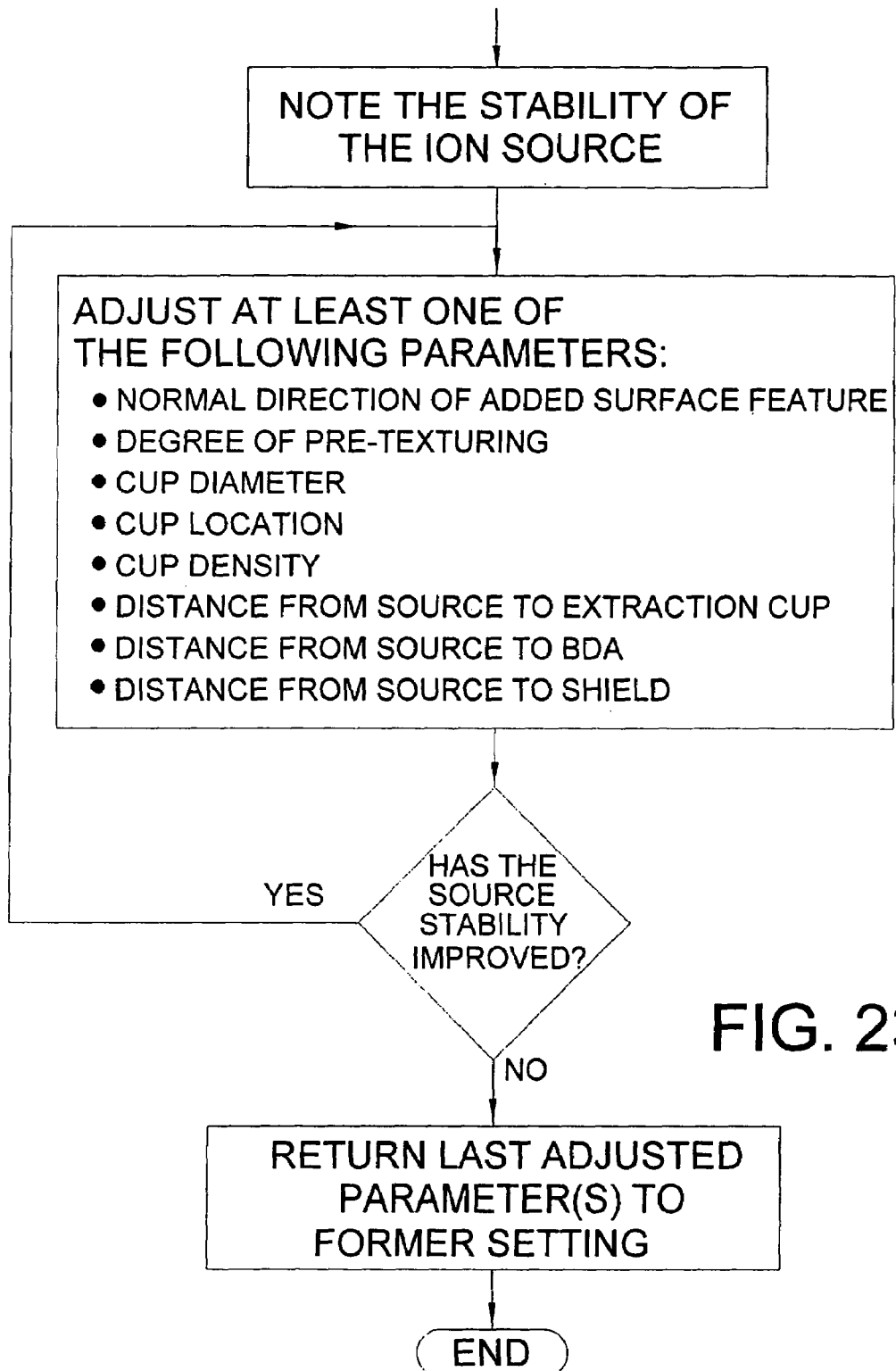
FIG. 23 is a flow chart showing a method according to the invention showing steps to optimize ion column design by selectively adding and/or adjusting added surface contours and other ion column parameters according to the invention.

FIG. 23 is a flow chart showing a method according to the invention showing steps to optimize ion column design by selectively adding and/or adjusting added surface contours and other ion column parameters according to the invention. Illustrative steps include:
 observing the stability of the ion source;
 adjusting at least one of: a the normal direction of said added surface feature, amount of pre-texturing of said added surface feature; cup diameter of cups defined in said added surface feature; cup location of cups defined in said added surface feature; a cup density of cups defined in said added surface feature; a distance from the source to an extraction cup; a distance from the source to a BDA; a distance from the source to a source shield;
 determining whether or not the stability of the ion source has improved;
 repeating said adjusting step and said determining step until an optimal level of stability of the ion source has been achieved.

Figure 24:
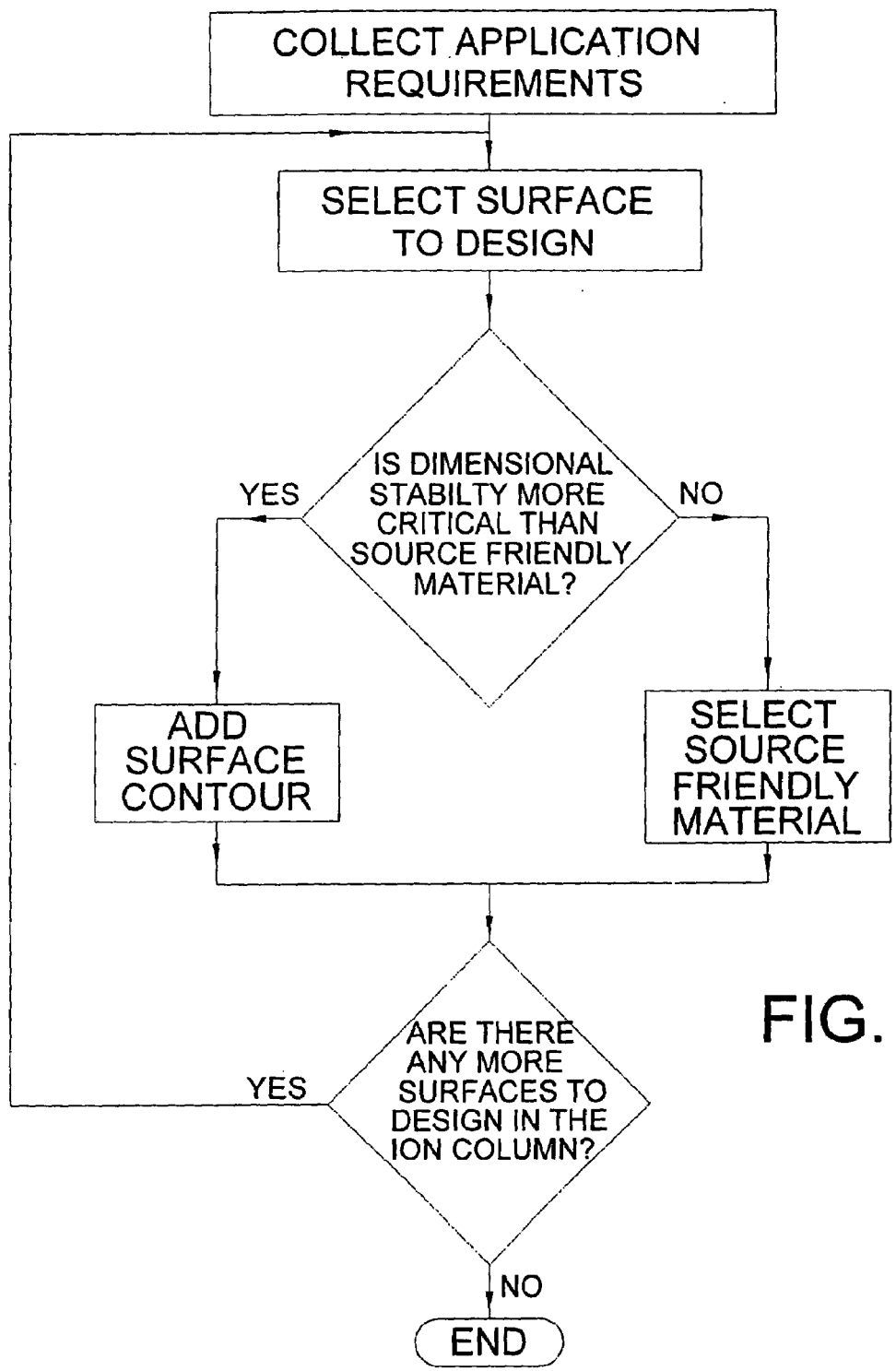
FIG. 24 is a flow chart showing a method according to the invention showing steps to optimize ion column design by balancing using source friendly material and selectively adding surface contours according to the invention.

FIG. 24 is a flow chart showing steps involved in a method of designing an ion column optimized for a specific application. An ion column is constructed by selecting a first material having good dimensional stability and forming the material into a shape which inhibits sputtered material, released when impacted by ions from the ion source, from traveling in a direction toward the ion source; and selecting a second material being made from a source friendly material and constructing other portions of the ion beam arrangement. A material having good dimensional stability is one which is neither too soft nor too brittle, and one which is not too porous. An example of a material with good dimensional stability is Molybdenum.

Some embodiments of the invention provides an ion beam arrangement which inhibits back sputtered material from traveling in a direction toward the ion source.

Some embodiments of the invention capture back sputtered material by providing a surface defining cups proportioned to let ions enter but which prevents material freed from impact by ions from leaving the holes.

Some embodiments of the invention enable the distance between the source and the BDA to be reduced thereby increasing column performance.

In some embodiments, the invention does not require an additional shield element to be added to the particle beam column; the surface contours can be added directly onto components such as an extractor element or a beam-defining aperture, or other optical element. If a separate shield is used, it can be spaced between other optical elements or can rest directly on another element.

The invention can be applied to elements at any position in the optical column from which material can be back-sputtered. Although the invention is useful in a liquid metal ion source column, it is also useful in other particle or energy beam columns, such as ion columns using other types of ion sources and electron beam columns.

The invention has broad applicability and can provide many benefits as described and shown in the examples above. The embodiments will vary greatly depending upon the specific application, and not every embodiment will provide all of the benefits and meet all of the objectives that are achievable by the invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What we claim is:

1. An ion column having an ion source comprising: an added surface contour which when impacted by ions from the ion source inhibits molecules from said added surface contour from being ejected in a direction substantially toward the ion source.

2. An ion column according to claim 1 wherein the ion column includes a beam defining aperture and a shield, said added surface contour is on at least one of said beam defining aperture and said shield.

3. An ion column according to claim 1 wherein said added surface contour is a plurality of cups proportioned to allow ions to enter but said cups inhibit material knocked free by the ions from exiting said cups.

4. An ion column according to claim 3 wherein said cups are arranged in a honeycomb pattern, a grid pattern, or a close-pack pattern.

5. An ion column according to claim 3 wherein the bottoms of said plurality of said cups are angled away from normal to the incident beam.

6. An ion column according to claim 3 further comprising angled surfaces being angled away from normal to the incident beam between each of said plurality of cups.

7. An ion column according to claim 3 wherein the walls of said cups are angled from the axis of the cups.

8. An ion column according to claim 3 wherein one of said cups is a through hole defining a beam defining aperture.

9. An ion column according to claim 1 wherein said cups have a depth to diameter ratio of at least 5:1.

10. An ion column according to claim 1 wherein said cups have a depth to diameter ratio of at least 10:1.

11. An ion column according to claim 1 wherein said added surface contour is at least one angled surface being angled away from normal to the incident ion beam.

12. An ion column according to claim 11 wherein said at least one angled surface defines a plurality of cups proportioned to allow ions to enter but said cups inhibit material knocked free by the ions from exiting said holes.

13. An ion column according to claim 11 wherein the ion column has a central axis said angled surface is a conical surface being centered on the central axis, said conical surface defines a center bore therethrough substantially centered on said central axis, a beam defining aperture defining a hole therethrough, said hole being positioned along the center bore allowing ions to pass through said hole.

14. An ion column according to claim 13 wherein the apex of the conical surface points toward the ion source and the beam defining aperture is located near the apex of the cone defined by the conical surface.

15. An ion column according to claim 13 wherein the apex of the conical surface points toward the ion source and the beam defining aperture is located near the base of the cone defined by the conical surface.

16. An ion column according to claim 13 wherein the apex of the conical surface points away from the ion source and the beam defining aperture is located near the apex of the cone defined by the conical surface.

17. An ion column according to claim 1 wherein said added surface contour is a plurality of angled surfaces being angled away from normal to the incident ion beam.

18. An ion column according to claim 1 wherein said added surface contour is a plurality of angled surfaces having random normal directions.

19. An ion column according to claim 1 wherein said added surface contour is a textured surface created by exposure to an ion stream before use with the ion column.

20. An ion column according to claim 1 wherein said added surface contour include a plurality of dendrite cones.

21. An ion column according to claim 20 wherein said dendrite cones are oriented with the axis of the cones normal to the axis or the ion column.

22. An ion column according to claim 20 wherein said dendrite cones are on a surface being angle away from the normal to the incident beam.

23. An ion column according to claim 20 wherein said plurality of dendrite cones are formed by exposure to an ion stream before use with the ion column.

24. An ion column comprising: a beam defining aperture defining a hole therethrough arranged to allow a first portion of ions from an ion source to pass through said hole and an area around said hole having a contour which deflects sputter caused by collisions with a second portion of the ions from the ion source away from the ion source.

25. An ion column according to claim 24 further comprising a shield arranged between the ion source and said beam defining aperture, said shield defining a shield hole arranged to allow a third portion of ions to pass through said shield hole and a shield area around said shield hole having a shield contour which deflects sputter caused by collisions with a fourth portion of the ions from the ion source away from the ion source.

* * * * *